United States Patent
Wolfe, Jr.

(10) Patent No.: US 7,082,387 B1
(45) Date of Patent: Jul. 25, 2006

(54) SYSTEM AND METHOD FOR SIMULTANEOUS CONSTRUCTION OF PHYSICAL AND CAD MODELS

(75) Inventor: Robert H. Wolfe, Jr., Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/500,293

(22) Filed: Feb. 8, 2000

(51) Int. Cl.
 *G06G 7/34* (2006.01)
 *G06F 17/50* (2006.01)
 *G06F 19/00* (2006.01)

(52) U.S. Cl. ............................. 703/6; 703/1; 700/98

(58) Field of Classification Search ............ 702/91–95; 382/154, 295, 302, 318; 345/156; 703/11, 703/8, 6, 1; 434/72, 73, 74; 700/98
See application file for complete search history.

(56) References Cited

U.S. PATENT DOCUMENTS

| | | | |
|---|---|---|---|
| 3,927,948 A | 12/1975 | Cox et al. ................... 356/496 |
| 4,275,449 A * | 6/1981 | Aish ............................. 703/1 |
| 4,823,395 A * | 4/1989 | Chikauchi ................... 382/199 |
| 4,833,724 A * | 5/1989 | Goel .......................... 382/318 |
| 4,918,627 A * | 4/1990 | Garcia et al. ................. 702/82 |
| 5,237,647 A * | 8/1993 | Roberts et al. ............. 345/419 |
| 5,561,526 A | 10/1996 | Huber et al. ................ 356/604 |
| 5,764,217 A | 6/1998 | Borrel et al. ............... 345/156 |
| 5,796,386 A | 8/1998 | Lipscomb et al. .......... 345/156 |
| 5,818,959 A | 10/1998 | Webb et al. ................ 382/154 |
| 5,975,908 A * | 11/1999 | Hulten ........................ 434/72 |
| 6,031,941 A * | 2/2000 | Yano et al. ................. 382/276 |
| 6,603,476 B1 * | 8/2003 | Paolini et al. .............. 345/427 |

FOREIGN PATENT DOCUMENTS

JP    6037073    2/1985    ................ 429/34

OTHER PUBLICATIONS

Ouhyoung et al., "A Three-Dimensional Building Authoring Tool Based on Line Drawing Understanding" p. 1996. MIT p. 1-12.*

* cited by examiner

*Primary Examiner*—Paul L. Rodriguez
*Assistant Examiner*—Tom Stevens
(74) *Attorney, Agent, or Firm*—F. Chau & Associates, LLC; Frank V. DeRosa, Esq.

(57) ABSTRACT

A system and method for simultaneous construction of a corresponding CAD model and physical model, wherein the CAD model comprises a plurality of CAD representations each corresponding to a physical component part that is used to construct the physical model. During construction of a physical model using individual component parts, the CAD system can identify a given component part and retrieve its CAD representation from a CAD library. In addition, the CAD system allows the user to build a CAD representation of a given component part if its CAD representation is not stored in the CAD library. After the CAD representation of the component part is generated, the CAD system will track the motion (position and orientation) of the part as it is maneuvered into a desired position in the physical model. The position and orientation, as well as the CAD representation of the component part as it exists in the physical model is saved in a CAD model database. During assembly, the CAD system can render an image of the CAD model as each component part is placed in the physical model.

37 Claims, 11 Drawing Sheets

SYSTEM AND METHOD FOR SIMULTANEOUS CONSTRUCTION OF PHYSICAL AND CAD MODELS

BACKGROUND

1. Technical Field

The present application relates generally to computer-aided design (CAD) and, in particular, to a system and method for simultaneously constructing a CAD model and a corresponding physical model, wherein the CAD model comprises a plurality of CAD representations each corresponding to one of the component parts that are used to construct the physical model.

2. Description of Related Art

Conventionally, architects and other mechanical designers are accustomed to building a physical scale model of their intended design before generating a CAD model corresponding to the physical model. For instance, when designing a commercial or public project, an architect will typically construct a physical scale model before creating a CAD model for developing construction plans and for laying out the floor plans of offices and other rooms. The physical model is typically constructed using a combination of standard parts such as standard size wall panels, as well as custom parts that are specifically created by the architect to represent unique structures in the physical model. After the physical model has been constructed using the physical component parts, the architect will generate a CAD model corresponding to the physical model.

With currently available CAD systems, architects must rely on the use of a 2-D display, a mouse-driven cursor, and keyboard entry to create 3D (three-dimensional) CAD models, which is a very tedious process. More particularly, the process of CAD modeling involves the creation and manipulation of graphic objects whose geometry data are stored in a computer memory (CAD database) or other storage devices. Typically, these graphic objects are manipulated in the model space by use of keyboard entry or by moving a cursor displayed on a computer screen (via a mouse, joystick, trackball, or other similar device) whereon a computer-generated image of a particular graphic object is also displayed.

In order to construct the CAD model using the graphic objects, however, the data for generating the graphic objects must first be collected by manually measuring all the corners and curves of the physical model and then manually inputting such data to the computer for processing by a CAD application. In addition, various methods known by those skilled in the art have been used for measuring the exterior of a completed physical model including a system for marking the corners of the physical model with a tracking sensor for automatic insertion in the CAD application. It is sometimes not possible, however, to track or measure certain corners of the physical model because they may be inside the physical model and, thus, inaccessible after the model has been built. For example, an atrium entrance lobby might be included in the scale model of a building, but the interior, load-bearing walls of the atrium may not be physically accessible for measurement because an entry facade may be in the way. Therefore, in such situations, the architect may not be able to generate a CAD model that accurately corresponds to the physical model without having to disassemble the physical model to measure the inaccessible corners, and then assemble the parts and repeat the process.

Accordingly, a CAD system and method that overcomes the above-mentioned shortcomings by providing an efficient tool for generating CAD models of corresponding physical models is highly desirable.

SUMMARY OF THE INVENTION

The present invention is directed to a system and method for simultaneous construction of a corresponding CAD model and physical model, wherein the CAD model comprises a plurality of CAD representations each corresponding to a physical component part that is used to construct the physical model. During construction of a physical model using individual component parts, a CAD system according to one embodiment of the present invention can identify a given component part and retrieve its CAD representation from a CAD library. In addition, the CAD system allows the user to build a CAD representation of a given component part if its CAD representation is not stored in the CAD library. After the CAD representation of the component part is generated, the CAD system will track the motion (position and orientation) of the part as it is maneuvered into a desired position in the physical model. The position and orientation, as well as the CAD representation of the component part as it exists in the physical model is saved in a CAD model database. During assembly, the CAD system renders an image of the CAD model as each part is added.

In one aspect of the present invention, a CAD system comprises:

a data processing system comprising a CAD application, wherein the CAD application is executed by the data processing system to generate a CAD model of a physical model, the CAD model comprising a plurality of CAD representations each corresponding to a component part of the physical model;

and a tracking system for generating tracker data associated with a given component part, wherein the tracker data is processed by the data processing system to generate a CAD representation of the given component part and determine the position and orientation of the component part with respect to the physical model as the component part is placed in a desired position in the physical model.

In another aspect of the present invention, a method for generating a CAD model of a corresponding physical model comprising a plurality of component physical parts comprises the steps of:

generating a CAD representation of a given component physical part based on relevant points of the component physical part;

tracking coordinates of the relevant points of the CAD representation of the component physical part in relation to coordinates of the CAD model as the physical component part is placed in a desired position in the physical model; and adding the CAD representation of component physical part to the CAD model such that the CAD model comprises an ensemble of individual CAD representations of component physical parts.

These and other aspects, features and advantages of the present invention will be described and become apparent from the following detailed description of preferred embodiments, which is to be read in connection with the accompanying drawings.

DETAILED DESCRIPTION OF PREFERRED EMBODIMENTS

Figure 1:
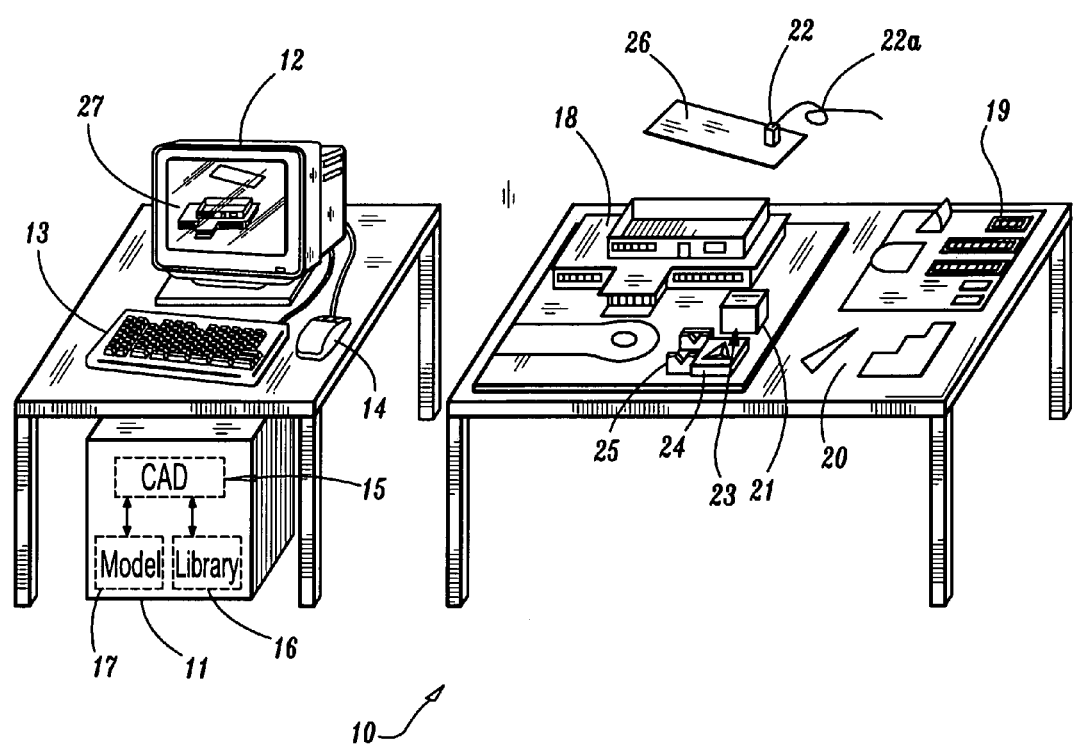
FIG. 1 is a schematic diagram of a CAD system for constructing corresponding physical and CAD models according to an embodiment of the present invention.

Referring now to FIG. 1, a schematic diagram illustrates a system according to an embodiment of the present invention for simultaneously constructing a corresponding physical model and CAD model. The system 10 comprises a data processing device 11 (e.g., a personal computer), a graphics display unit (monitor) 12, and one or more input devices such as a keyboard 13 and a pointing device 14 (e.g., a mouse, trackball, spaceball, etc.). The data processing device 11 comprises memory and at least one processor for storing and executing a CAD application 15 which, in accordance with the present invention, dynamically builds and stores a CAD model 17 of a corresponding physical structure 18 as the physical structure 18 is constructed. The CAD application 15 processes graphics data (or pixel data) representing the CAD model 17, which is output to the display unit 12 for displaying the current state of the CAD model (as denoted by reference numeral 27) during construction of the physical assembly 18. The CAD application 15 maintains a CAD library 16 comprising CAD representations (models) of standard component parts 19. As explained in further detail below, each of the CAD models stored in the library 16 represent, for instance, CAD models of standard parts (components) 19 used for constructing the physical model 18. As further explained below, the CAD application 15 also provides "relational" and "shape" processes for creating CAD models of custom parts 20 that are used for constructing the physical model 18.

The CAD system 10 further comprises a coordinate sensing system (or tracking system) including a stationary tracker unit 21 (hereinafter referred to as "tracker source" or "TS") that generates, e.g., a 3-D electromagnetic or ultrasound field, and at least one sensor device 22 (hereinafter referred to as a "tracker free member" or "TFM"). The coordinate sensing system may be any tracking system suitable for implementation with the present invention such as the commercially available 3SPACE® FAST TRACK™ system by Polhemus, Inc. As shown in FIG. 1, the TS 21 may be affixed to the surface of a table upon which disposed is the physical model assembly 18. In one embodiment, the TS 21 has a fixed position and orientation with respect to the physical model assembly 18.

As illustrated in FIG. 1, the TFM 22 can engage (or otherwise connect to) a component part 26. The TFM 22 intercepts the electromagnetic/ultrasound field generated by the TS 21, and then outputs a signal representing the position and orientation of the TFM 22 with respect to the TS 21 in, e.g., three degrees of freedom for two dimensional models and 6 degrees of freedom for three dimensional models as is understood by those skilled in the art. The output signal (tracker data) of TFM 22 is supplied to the data processing device 11 via a communication link 22a (e.g., a cable, an RF (radio frequency) interface or an IR (infrared) interface). As explained in greater detail below, when a component part (19, 20 or 26) is attached to the TFM 22, the CAD application 15 processes the tracker data (and other relevant data) to generate and display a CAD representation of the attached component part.

Figure 4A:
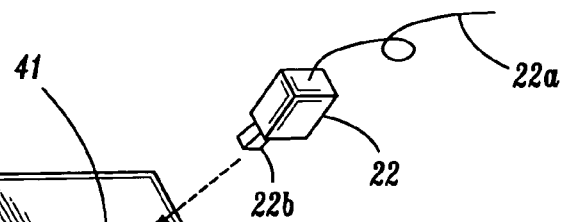
FIGS. 4a, 4b, and 4c are diagrams of alternate embodiments according to the present invention for providing docking of a tracker free member to standard parts.
Figure 4B:
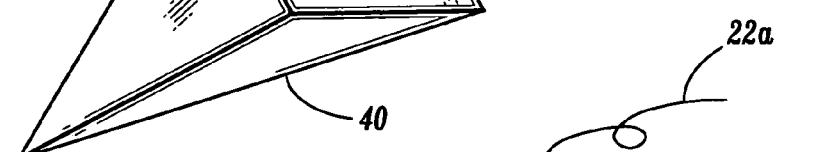
Figure 4C:
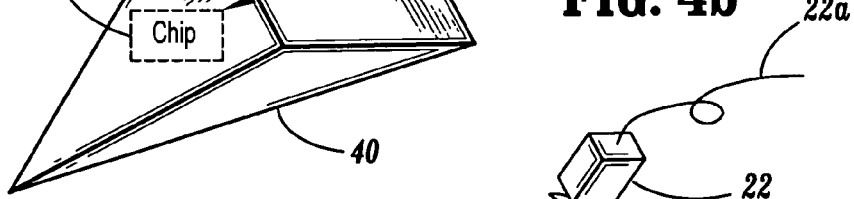

FIGS. 4a–4c illustrate various methods for connecting (or docking) the TFM 22 and a component part. In one embodiment, the TFM 22 comprises a physical attachment apparatus that is capable of readily attaching to and detaching from one or more surfaces of the component physical parts used to construct the model assembly. For example, as shown in FIG. 4a, the TFM 22 may comprise a docking mechanism 22b that insertably engages a receptacle 41 on a model part 40. In this embodiment, the receptacle 41 is shaped to encode the model characteristics of the part 40. For example, a model part having a cube shape would have a receptacle 41 of a certain shape, and a model part having a rod shape would have a receptacle of a different shape. The docking mechanism 22b can include one or more sensors for sensing the shape of the receptacle 41 and transmitting a corresponding part ID of the identified part to the data processing device 11. The part ID is then used to retrieve the corresponding pre-stored CAD representation of the part from the CAD library. In this embodiment, the CAD representation in the CAD library may also include information regarding the docking position of the mating receptacle 41 on the part 40. As explained below, this information (e.g., geometry data and docking position) is then used by the CAD application 15 to determine the position and orientation of the part relative to the TFM 22.

In another embodiment illustrated in FIG. 4b, a keyed receptacle of a single shape 41a is electrically connected to a microchip 42 in the component part 40. Rather than encoding the part ID via the shape and size of the receptacle, the microchip 42 would transmit the part ID to the data processing device 11 via the TFM 22 so as to identify the part.

In yet another embodiment illustrated in FIG. 4c, the TFM 22 includes suction cup 22c or any adhesive surface that allows the user to attach the TFM 22 to the model part 40.

In this embodiment, since the model part 40 does not have a pre-molded receptacle, the docking position of the TFM 22 on the part is arbitrary in all instances. In addition, this docking mechanism does not provide for a part ID to be automatically transmitted to the data processing device. Consequently, when the part 40 is a standard part having a CAD representation stored in the CAD library, a "relational process" described in detail below is used to measure one or more points on the part so as to determine the docking position of the TFM 22. In addition, for custom parts having no pre-stored CAD representation in the CAD library, a "shape process" described in detail below is used to measure all relevant points of the part to determine the shape geometry.

Figure 4D:
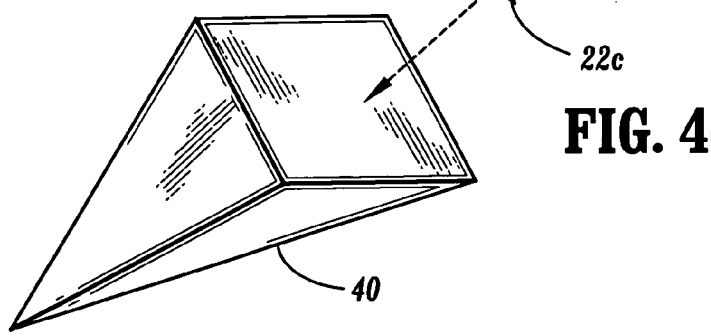
FIG. 4d is a schematic diagram of a standard part that may be employed without utilizing a tracker free member.

In another embodiment illustrated in FIG. 4d, rather than using a TFM 22 at all, a component part 40 can contain an imbedded sensor and transmitter 43 for transmitting the part ID as well as the position and orientation of the part to the TS 21. The sensor 43 can be a miniaturized version of a coil triad used in the Polhemus system (or any other suitable magnetic tracking system, or an array of ultrasound transducers or receivers, etc.). The imbedded system can be configured to operate on command, so as to generally remain dormant and not interfere with other parts.

Figure 5A:
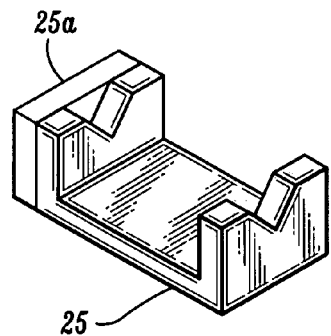
FIGS. 5a, 5b, 5c, 5d and 5e are schematic diagrams of exemplary marking jigs according to the present invention that may be used for measuring geometry data of model parts.
Figure 5B:
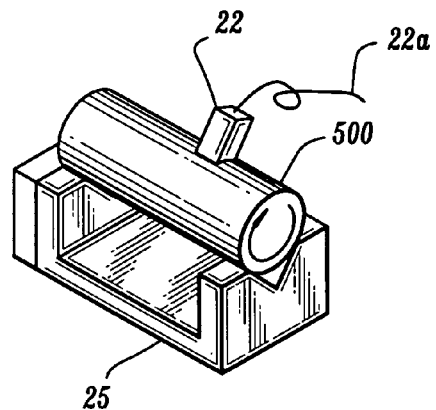
Figure 5C:
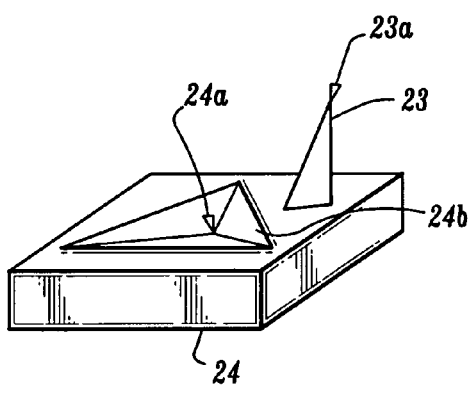
Figure 5D:
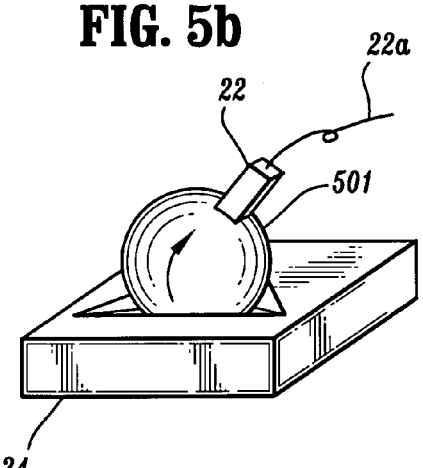
Figure 5E:
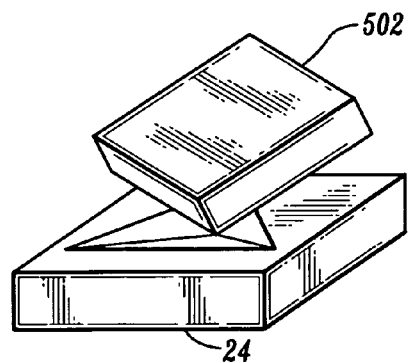

To perform a measurement (shape or relational) process indicated above, the CAD system 10 further comprises various units (or "marking jigs") that may be used for marking corners of custom parts or standard parts with arbitrary docking positions. For instance, as shown in FIGS. 1 and 5, the marking jigs comprise, for example, a marking jig 25 for measuring cylindrical parts, a marking jig 24 having an apex 24b for measuring the radius of spherical shapes (such as shown in FIG. 5d) and a fixed contact point 24a for marking outside corners of shapes (such as shown in FIG. 5e). In addition, the marking jig 24 is illustrated as having a obolisque 23 with a fixed reference point 23a for marking inside corners of shapes. Each of these marking jigs are set at a fixed position relative to the TS 21 when a component part is being measured. Various marking techniques (as well as the use of such marking jigs) according to exemplary embodiments of the present invention will be explained in greater detail below.

Figure 2:
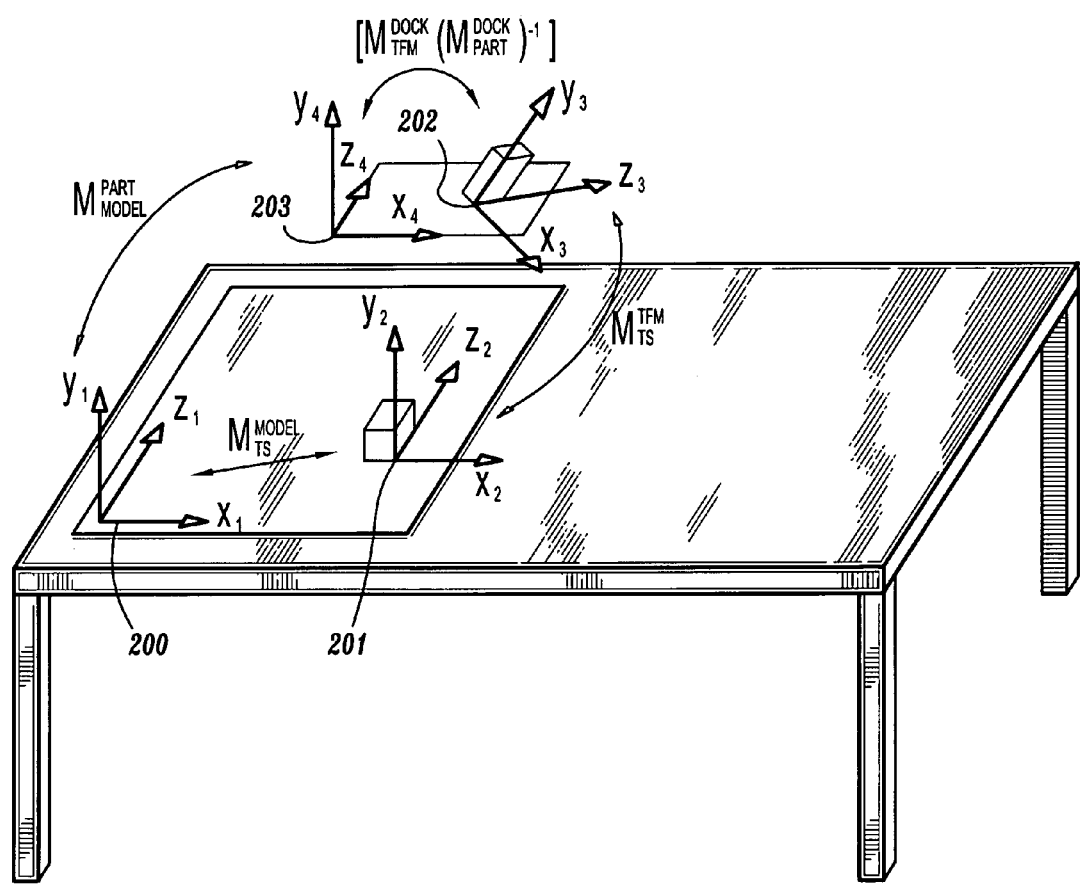
FIG. 2 is a diagram illustrating transformation relationships between coordinate systems of components of the CAD system of FIG. 1.

Referring now to FIG. 2, a diagram illustrates transformation relationships between coordinates of components of the system of FIG. 1. A CAD model coordinate system 200 is depicted by orthogonal axes X1, Y1 and Z1. The CAD coordinate system 200 represents the CAD model 17 (of the physical model 18) in the CAD system. The origin of the CAD model coordinate system can be selected at any point in space, e.g., at any point in close proximity to the physical model 18 or a standard reference point at a remote location to which all CAD models are referenced (as is understood by those skilled in the art). The other coordinate systems shown in FIG. 2 include a TS coordinate system 201 depicted by orthogonal axes X2, Y2, and Z2 which is fixed in relation to the model coordinate system 200 (and which may also be selected at any suitable point), a TFM coordinate system 202 depicted by orthogonal axes X3, Y3, and Z3; and a part coordinate system 203 depicted by orthogonal axes X4, Y4, and Z4.

As is understood by those skilled in the art, the relationship between any one of the coordinate systems with respect to position and orientation may be defined by a transformation represented by three translational displacements $\Delta X$, $\Delta Y$, and $\Delta Z$ and three rotational displacements $\theta x$, $\theta y$, and $\theta z$ (as well as any necessary scaling factors). For instance, the transformation characterizing the position and orientation of the part coordinate system 203 with respect to the model coordinate system 200 denoted as $M_{Model}^{Part}$ can be defined by the following equation:

$$M_{Model}^{Part} = (M_{TS}^{Model})^{-1}(M_{TS}^{TFM})(M_{TFM}^{Dock})(M_{Part}^{Dock})^{-1} \quad (1)$$

wherein the term $M_{TS}^{Model}$ is a transformation representing the correspondence between the model coordinate system 200 and the tracker (stationary) source coordinate system 201, the term $M_{TS}^{TFM}$ is a transformation representing the correspondence between the TFM coordinate system 202 and the TS coordinate system 201, the term $M_{TFM}^{Dock}$ is a transformation between the docking position of the part and the TFM coordinate system 202, and the term $M_{Part}^{Dock}$ is the transformation between the docking position and the part coordinate system 203. In addition, as illustrated in FIG. 2, the term $M_{TFM}^{Dock}(M_{Part}^{Dock})^{-1}$ represents the correspondence between the part coordinate system 203 and the TFM coordinate system 202.

It is to be appreciated that after the reference points for the model coordinate system 200 and TS coordinate system 201 are selected, a calibration procedure can be performed for establishing the relationship between these two coordinate systems, such as described in U.S. Pat. No. 5,764,217 to Borrel et al., entitled "Schematic Guided Control Of The View Point Of A Graphics Processing And Display System" and U.S. Pat. No. 5,796,386 to Lipscomb et al., entitled "Precise Calibration Procedure For Sensor-Based View Point Control System," both of which are commonly assigned and fully incorporated herein by reference.

In addition, for tracking systems (such as the Polhemus system described above) having a TFM device that comprises a sensor disposed within a housing unit, the calibration procedure described in the above-incorporated patents may be used to calibrate the relationship between the sensor and the housing. More specifically, depending on the tracking system employed, the term $M_{TS}^{TFM}$ in the above equation (1) may represent the relationship between the coordinate systems of the housing of the TFM with respect to the TS, which term may be computed by $M_{TFMsensor}^{TFMhousing}$ ($M_{TS}^{TFMsensor}$). As such, the calibration procedure can be utilized to account for the orientation of the sensor with respect to the housing of the TFM.

Figure 3:
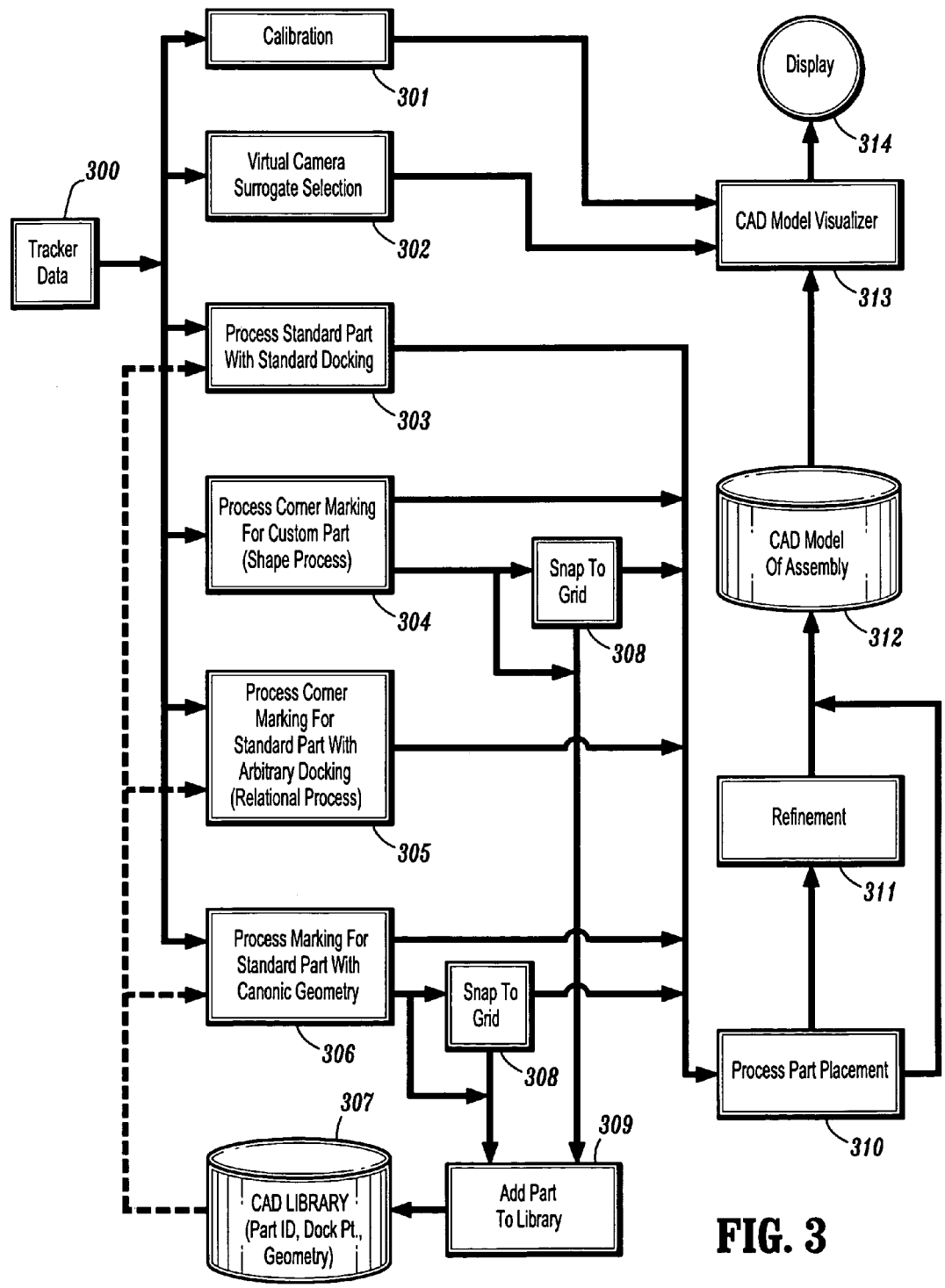
FIG. 3 is a block/flow diagram of a system/method for generating a CAD model according to an embodiment of the present invention.

Referring now to FIG. 3, a diagram illustrates a CAD system and method according to a preferred embodiment of the present invention. In particular, FIG. 3 provides a detailed diagram of functional modules of the CAD application 15 of FIG. 1 according to an exemplary embodiment, as well as a flow diagram of a method for generating a CAD model in accordance with one aspect of the present invention. It is to be understood that the CAD system and methods described herein are preferably implemented in software as an application comprising program instructions that are tangibly embodied on a program storage device (e.g., magnetic floppy disk, RAM, CD ROM, ROM, etc.) and executable by the data processing device 11 or any device or machine comprising suitable architecture. It is to be further understood that, because some of the constituent system modules and method steps depicted in the accompanying Figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

In FIG. 3, a block of tracker data 300 is transmitted from the TFM and input to the CAD system for processing. Depending on the type of tracker data 300 received, the CAD system can process the tracker data 300 in one of various manners depending on what process is selected by the user. For instance, the user can select a calibration process 301 to process the tracker data 300 (using the methods described in the above incorporated references) to establish the relationship between the tracker data to the position and orientation in the CAD model representation (e.g., providing the necessary scaling factor to scale TFM data (coordinates) to the CAD model representation). For example, in the Polhemus tracking system noted above, the x, y, z positions of the TFM are provided in cm (centimeters). Assuming the CAD model is based in feet, during a corner marking process (as described below), the necessary scaling factor must be pre-established so as to appropriately translate the TFM coordinates (in cm) to the coordinates of the CAD model (in feet).

The exemplary CAD system further comprises a virtual camera surrogate selection (VCSC) process 302 that allows the user to utilize the TFM as a surrogate for controlling a rendered view of the CAD model on the display (such as described in the above-incorporated U.S. Pat. No. 5,796,386). More specifically, as the user maneuvers the TFM about the physical model, the VCSC module 302 processes the received tracker data 300 to render a view on a display 314 similar to that which would be seen by a virtual camera positioned near the CAD model at the place corresponding to the position of the TFM with respect to the physical model. In another embodiment, a standard part can be designated as the camera. This standard camera part may be attached to the TFM to transmit the tracker data used for rendering the view. Alternatively, the standard part may comprise an embedded sensor which directly transmits the tracker data that is processed for rendering the view. In any event, as this standard camera part is maneuvered, the rendered view will change based on the position of the standard camera part with respect its placement. The TFM may then be removed from this standard part to be used elsewhere, in which case the view is frozen to the last measured position of the camera part.

The CAD system comprises a module 303 for processing standard parts with standard docking positions. When a standard part with a standard docking position is indicated by the user or otherwise identified by the CAD system as discussed above, the size and shape of the part, as well as the docking position, is obtained from the CAD library 307. This data may then used for rendering an image of the component CAD model for the part for viewing by the user on the display 314. A detailed description of this process according to one aspect of the invention will be provided below with reference to FIG. 6.

The CAD system further comprises what is referred to herein as a "shape process" module 304 for processing corner markings of a custom part so as to generate a component CAD model for the custom part. This process is selected by the user when a custom part is created having a shape that is unknown to the CAD system (i.e., the shape information is not stored in the CAD library 307), so as to provide the necessary data for determining the size and shape of the part. Indeed, for a custom part, the size, shape and docking position of the component part (which are used for generating a component CAD model of the component part) are unknown parameters.

With the shape process, the TFM is first attached to the custom part (using one of the methods described above) and the TFM is then maneuvered so that each corner of the part can be contacted to a point in space that is fixed in relation to the TS. For instance, as shown in FIGS. 5c and 5e, each outside corner of the polygonal shape 502 may be contacted to the inner converging point 24a of the apex of marking jig 24. Alternatively, each corner may be contacted to point 23a of marking jig 23 (although this marking jig is best used for inside corners of parts due to its protrusion).

Then for each corner, the tracker data 300 representing the position and orientation of the TFM for each of the corner fixes is processed by the shape process module 304 to determine the shape of the part and its position and orientation with respect to the TFM. With this information, a component CAD model may be generated representing the custom part. A detailed description of this "shape process" according to one aspect of the present invention will be described below with reference to FIG. 8.

The CAD system further comprises what is referred to herein as a "relational process" module 305 for processing corner markings of a standard part with an arbitrary docking position. The relational process may be selected by the user when the corners of a standard part (i.e., the geometry and size) of the shape are known parameters that may be retrieved from the CAD library 307, but the docking position of the TFM is an unknown parameter. This situation may arise when, e.g., a plurality of standard parts of a known shape and size are molded without standard docking positions. Unlike the shape process, however, because the size and shape of the part is known a priori, the relational process requires less corner marking steps to determine the relation between the docking position and the corners of the shape. Indeed, for the shape process, the position and orientation of the TFM are measured for each corner, and such data is used to determine the shape of the part and its position and orientation with respect to the TFM. With the relational process, since the CAD description (geometry data) of the standard part is presumed to reside in the CAD library, the user can enter the ID of the part, retrieve the CAD information from the library, and have the CAD representation displayed. Then, instead of touching all the corners of the part (as with the shape process described earlier), the user marks, e.g., three corners of the part and identifies in the display which corners were selected, for determining the position and orientation of the part with respect to TFM. A detailed description of a "relational process" according to one aspect of the present invention will be described below with reference to FIG. 7.

The CAD system further comprises what is referred to herein as a "canonic shape marking process" module 306 for processing markings of standard parts with canonic geometry (e.g., spheres, cylinders, etc.) Canonic shapes are shapes that can be described mathematically in terms of relatively few parameters such as a sphere in terms of its radius and a cylinder in terms of its length and radius (as well as other shapes such as pyramids or cones, etc.) The geometric information of such shapes are stored in the CAD library 307. FIG. 5b illustrates a process for marking a cylindrical part 500 using the marking jig 25 and FIG. 5d illustrates a process for marking a spherical shape 501 using marking jig 24. With these shapes, there are no corners that require marking. Instead, other parameters, e.g., radius, are determined by "rolling" the shape in the marking jig. A detailed description of several "canonic shape marking processes" according to the present invention will be described below with reference to FIGS. 9a and 9b.

The output of each of the above marking processes (304, 305 and 306) (as well as the standard part process 303) is a component CAD representation of the processed shape under consideration. This component representation may be rendered as an image for display so that the user can verify its accuracy (as explained below).

With respect to the output of the shape process module 304 and the canonic shape marking module 306, the user has the option of refining the component CAD model of the part via a grid snapping module 308 using, for example, a process that is well-known in the art as "snapping to a grid." For instance, assume that a component part under consideration was supposed to be a true rectangle, but the measured tracker data results in a component CAD model having a certain corner that is not square (90 degrees). To edit the component model, a rectangular grid can be generated and superimposed over the displayed component CAD rectangle, whereby the component CAD model is "snapped" to the grid to force the points of the CAD model to be relocated to the grid points. In addition, the user may specify the granularity of the grid so that a certain parameter of a component CAD part, e.g., the radius of a sphere, is set to the nearest foot, inch, centimeter, etc.

The CAD system further comprises a module 309 that affords the user the option of adding a CAD representation of a given component part to the CAD library after the CAD representation is generated via the shape process or the canonic shape marking process. For instance, assume the user has generated a plurality of geometrically similar custom parts. In the first instance, the user will perform the shape process described above to generate a component CAD representation of the custom part. If the user intends to regularly use such custom parts, the user can add the geometric data of the custom shape to the CAD library, thereby making the custom part a standard part. If the custom parts were constructed without standard docking ports, the relational process 305 may then be subsequently used for marking similar parts (since the geometry data is known and the docking would be arbitrary). On the other hand, if the custom parts were constructed with standard docking ports, the docking position data may also be stored in the CAD library so that the custom part may subsequently be processed via module 303 as a standard part with standard docking. In addition, as shown in FIG. 3, at the option of the user, a part may be added (309) to the CAD library 307 with or without refinement 308.

The CAD system further comprises a part placement module 310 that determines the position and orientation of the part attached to the TFM when the part is placed in a desired position in the physical model. More specifically, at the moment before the user releases the physical part from the TFM, part placement module 310 processes the tracker data representing the position and orientation of the TFM and, in conjunction with the previously determined position and orientation of the part with respect to the TFM, determines the position and orientation of the part with respect to the CAD representation of the model (using, e.g., equation 1 above). The assembled CAD model is updated in database 312.

A refinement process 311 may be selected at the option of the user to modify the placement and/or size and shape of a newly added component CAD part. This process may employ, for example, the grid snapping process discussed above.

A CAD model visualizer 313 renders an image of the CAD model for view on the display 314. It is to be understood that the CAD model visualizer 313 may employ any suitable conventional image rendering method. It is to be appreciated that as each part is added to the physical model, the computer display of the assembled CAD model is refreshed to show the addition of the parts.

Figure 6:
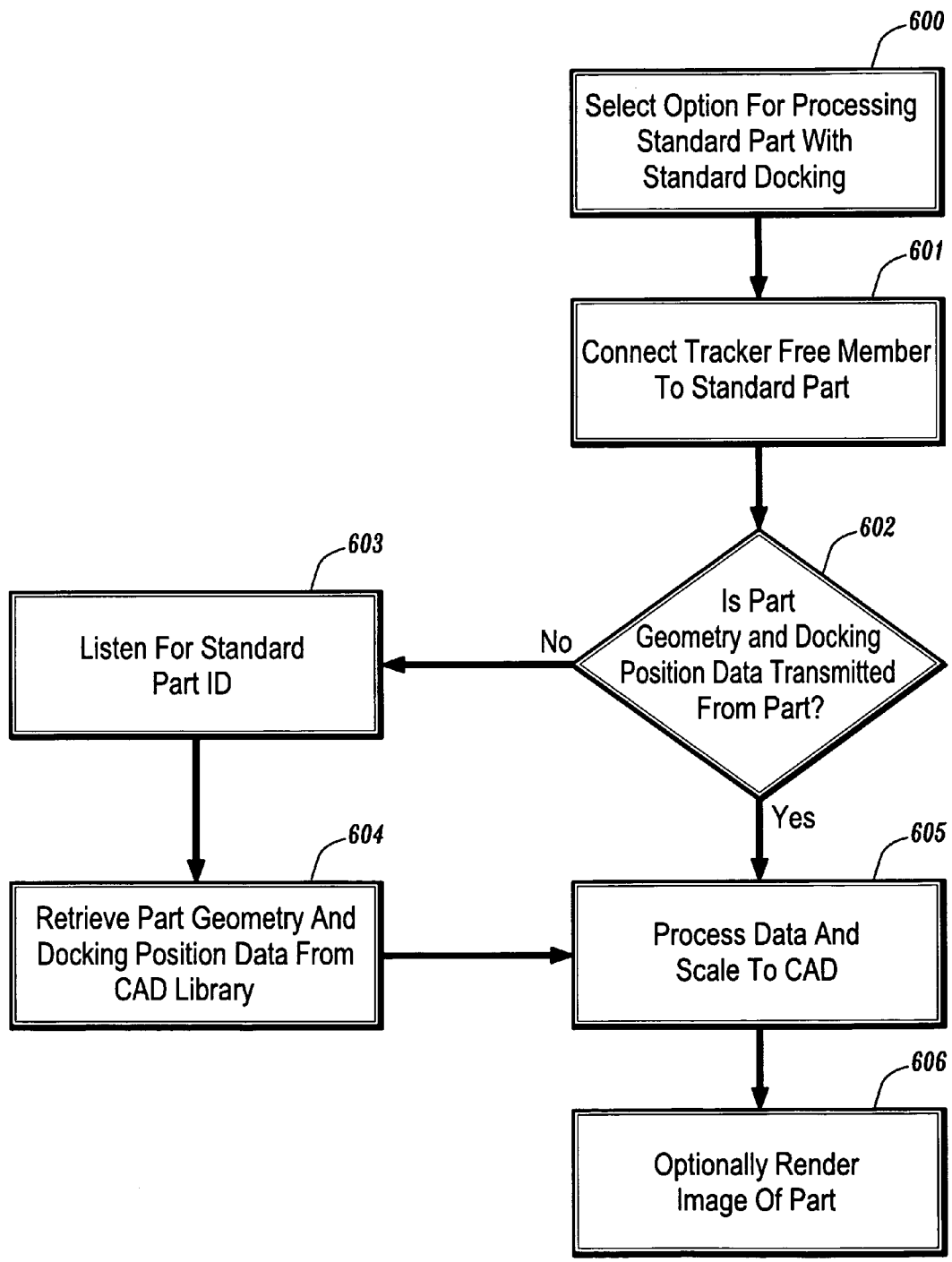
FIG. 6 is a flow diagram of a method for processing a standard model part with a standard docking position according to one aspect of the present invention.

Referring now to FIG. 6, a flow diagram illustrates a method for processing a standard model part with a standard docking position according to one aspect of the present invention. In particular, the method depicted in FIG. 6 illustrates, in detail, an exemplary method of operation of the standard part processing module 303 described above with reference to FIG. 3. At some point during the course of building a physical model, the user may want to place a standard part with standard docking in the physical model. Initially, the user will select (e.g., clicking on an icon displayed on the computer screen) the option for standard part processing (step 600). The user will connect the TFM to the desired standard part with standard docking position (step 601) in the manner depicted, for example, in FIG. 4a or 4b. It is to be understood that with a standard part with standard docking, steps 600 and 601 may occur simultaneously, i.e., the option for standard part processing is triggered upon connection of the TFM to the standard part.

After the TFM in connected, depending on the type of docking connection, the geometry and docking position data of the standard part may be directly transmitted from the part (affirmative result in step 602) via the TFM for processing by the CAD application. This situation arises, for example, with the docking connection illustrated in FIG. 4b, where an embedded chip outputs this data to the TFM for transmission to the CAD application upon connection of the TFM. Alternatively, such information may be transmitted directly from the standard part without using a TFM as illustrated in the embodiment of FIG. 4d. If the geometry and docking position data of the part is not directly transmitted from the part (negative result in step 602), the CAD application will listen for a standard part ID (step 603). This standard part ID may either be transmitted from a chip embedded in the part (FIG. 4b), based on the shape of the docking receptacle on the part as sensed by the TFM (FIG. 4a) or entered manually by the user in the case where the part has a standard docking position but the part ID is not encoded in the chip or via the shape of the receptacle. When the CAD application receives the part ID, the geometry docking position data corresponding to the part ID will be retrieved from the CAD library (step 604).

Once the geometry and docking position data of the part is obtained, the data will be processed so that the position and orientation of the part with respect to the TFM can be determined and scaled to the CAD model (step 605). In addition, the CAD application may render an image of the part (step 606). With the part displayed on the screen, the user can, for example, verify the accuracy of the part's geometry and view the CAD representation as the physical part is placed in the desired position in the physical model.

Figure 7:
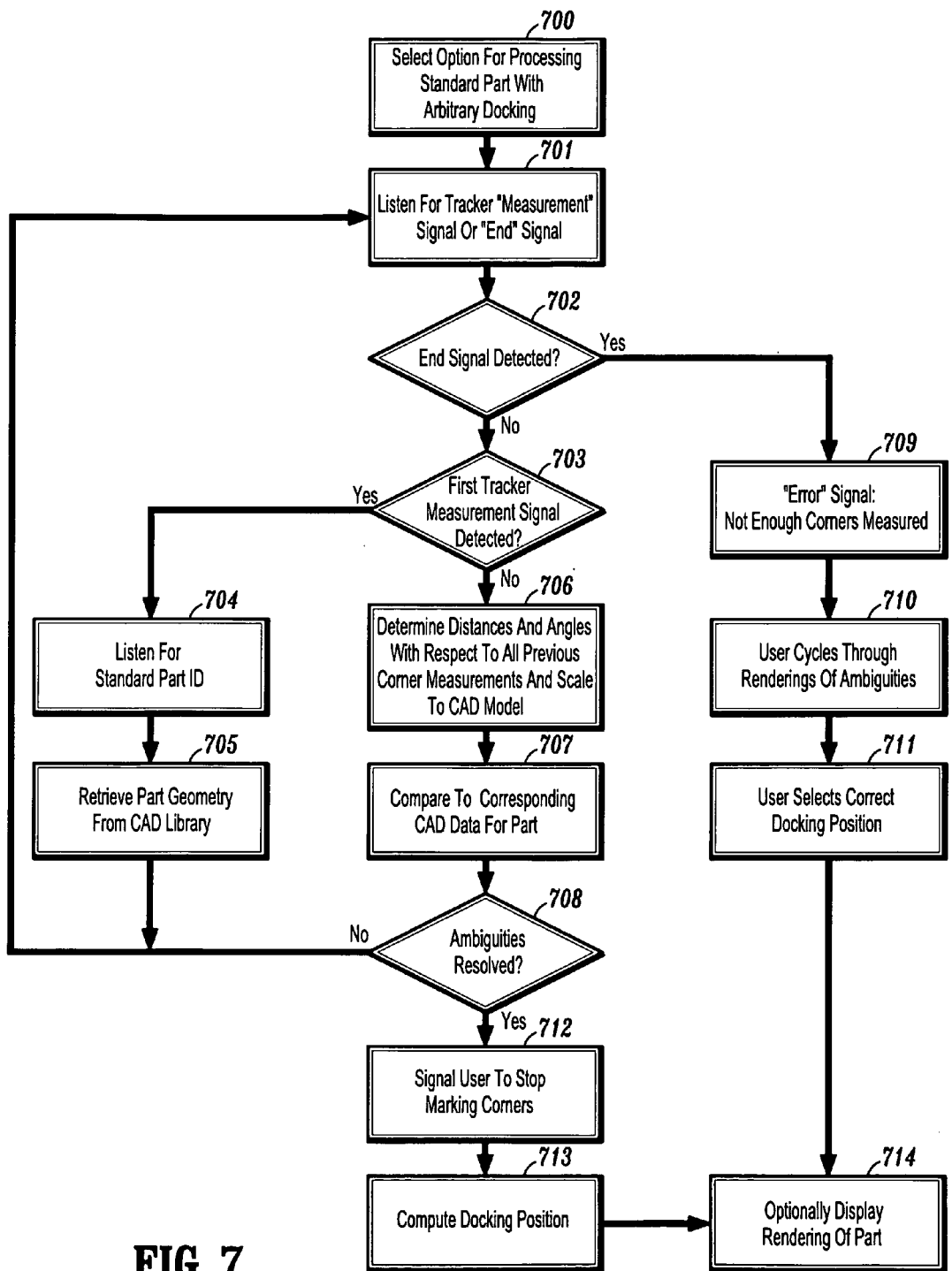
FIG. 7 is a flow diagram of a method for processing corner markings of a standard model part with an arbitrary docking position according to one aspect of the present invention.

Referring now to FIG. 7, a flow diagram illustrates a method for processing corner markings of a standard model part with an arbitrary docking position according to one aspect of the present invention. In particular, the method depicted in FIG. 7 illustrates, in detail, an exemplary method of operation of the relational process module 305 described above with reference to FIG. 3. At some point during the course of building a physical model, the user may want to place in the physical model a standard part that does not have a standard docking position. As noted above, a plurality of standard model parts may have been constructed without standard docking positions. In this situation, the CAD library includes the part ID and geometry of such parts, with such data being previously entered in the CAD library via, e.g., manual input or the result of a previous marking process.

Referring to FIG. 7, initially, the user will select (e.g., clicking on an icon displayed on the computer screen) the option for processing a standard part with arbitrary docking (step 700). The user will connect the TFM to the standard model part in an arbitrary position on the surface of the part in the manner depicted, for example, in FIG. 4c. The TFM is then maneuvered to contact a desired corner of the standard part to a point that is fixed in relation to the TS (e.g., points 24a or 23a on marking jigs 24 and 23, respectively, as depicted in FIGS. 5c and 5e). More specifically, the user will position a corner of the model part on the marking surface and press a button on the TFM to take a measurement, and the CAD application will recognize a tracker "measurement" signal as a result (step 701). Assuming the tracker measurement signal is the first tracker measurement signal detected (affirmative decision in step 702), the CAD application will wait for a standard part ID (step 704) as supplied by user input and then retrieve the geometry data from the library (step 705).

It is to be understood that at this point in the process, the CAD application will know the geometry of the part (e.g., know where all the corners are) but will not know where the docking position of the TFM is in relation to these known corners. As such, the user will continue to mark corners (i.e., provide more tracker data) until the CAD application can determine the docking position. The user will then position another corner of the model part on the marking surface and press the tracker button to signal another tracker measurement (return to step 701). The next step is to compute each vector going from a previous corner measurement to the current corner measurement (i.e., the distances and angles of the current tracker measurement will be determined with respect to all previous corner measurements and scaled to the CAD model) (step 706).

The current tracker measurement, as well as all previous tracker measurements, are compared to the CAD data (geometry data) for the part (previously obtained from the CAD library) (step 707). More specifically, this comparison is performed by checking the distances between the measurements against the distances between the CAD corner positions, as well as by checking the orientations of the distance vectors, relative to each other, with the corresponding CAD data for the corners.

If, upon such comparison, a unique match is found between the computed vectors for the measured corners with the vectors for the corners of the CAD model, then all ambiguities with respect to the docking position are deemed to be resolved (affirmative result in step 708) and the user will be signaled to stop taking corner measurements (step 710). The docking position will then be computed (step 713) and a rendering of the part may optionally be displayed (step 714). Preferably, to compute the docking position, the TFM coordinates of three of the measured corners are determined from the tracker data corresponding to such corners. These coordinates are compared to the corresponding CAD coordinates of the part (in the same manner as described in the above-incorporated calibration process) to obtain the transformation between the TFM coordinates and the part coordinates (as noted above, the docking position of the part is the origin of the TFM coordinate system). The origin of the TFM coordinate system, when transformed accordingly to the part coordinates, yields the docking position.

If, on the other hand, the ambiguities with respect to the docking position are not resolved (i.e., no unique match was found between the measured and CAD corners) (negative result in step 708), then the user should continue to measure additional corners until enough data has been collected to resolve such ambiguity (return to step 701). If, however, the user declares the measurement process complete by sending an "end" signal (e.g., pressing an icon or button in a window) (affirmative result in step 702), the system will issue an "error" signal (step 709) because more data is required to resolve the ambiguity. At this point, the system can display a rendering of the part with one of the ambiguous docking positions. The user can then cycle through rendering of each ambiguous docking position, if desired, so as to visually select the correct docking position (step 714). Alternatively, the use may continue to measure additional corners.

Figure 8:
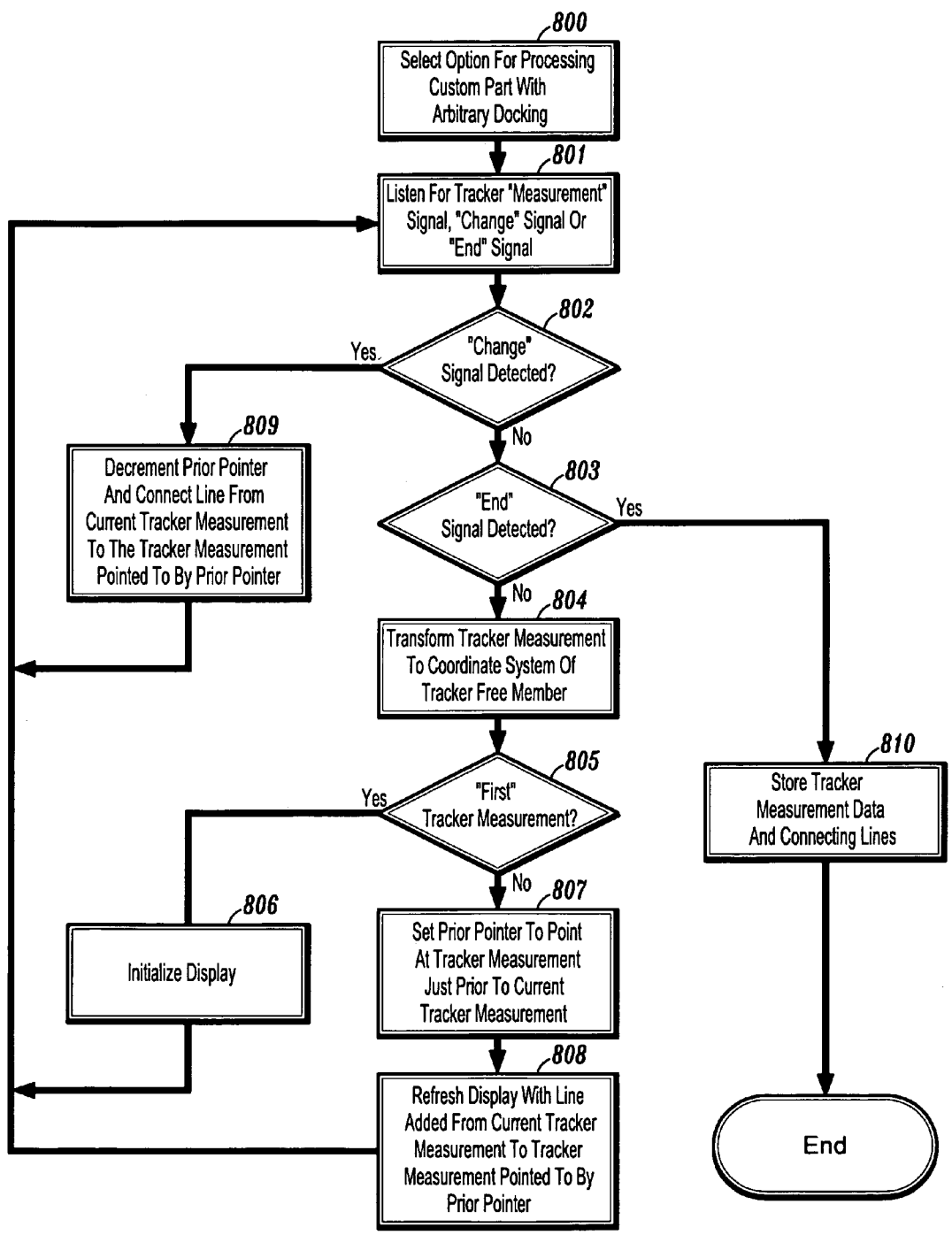
FIG. 8 is a flow diagram of a method for processing corner markings of a custom model part according to one aspect of the present invention.

Referring now to FIG. 8, a flow diagram illustrates a method for processing corner markings of a custom part according to one aspect of the present invention. In particular, the method depicted in FIG. 8 illustrates, in detail, an exemplary method of operation of the shape process module 304 described above with reference to FIG. 3. At some point during the course of building the physical model, the user may construct a custom part having no standard docking position to represent a unique structure in the physical model. Unlike the relational process described above, since there is no geometry data in the CAD library for the custom part, each corner of the custom part is measured to determine the positions of the corner with respect to the origin of the TFM (the docking position). With the shape process, as the user marks corners of the custom part, the CAD application continuously renders an updated image of the part by displaying the measured points (corners) of the custom part and drawing lines between such points. The user can then revise the rendered image if the user determines that two points were incorrectly connected.

More specifically, referring to FIG. 8, initially, the user will select (e.g., clicking on an icon displayed on the computer screen) the option for processing a custom part with arbitrary docking (step 800). The user will connect the TFM to the custom part in the manner depicted, for example, in FIG. 4c. The TFM is then maneuvered to mark a first corner (i.e., touching the corner to the fixed point such as points 24a or 23a on marking jigs 24 and 23, respectively, as depicted in FIGS. 5c and 5e. More specifically, the user will position the first corner of the custom part on the marking surface and press a button on the TFM (or the keyboard, etc.) to take a measurement, and the CAD application will recognize a tracker "measurement" signal as a result (step 801). The tracker measurement is then transformed to the coordinate system of the TFM (step 804).

Assuming the tracker measurement signal is the first tracker measurement signal detected (affirmative decision in step 805), a display will be initiated (step 806). As the user marks subsequent corners, the tracker measurements will be recognized (step 801) and transformed to the coordinate system of the TFM (step 804). For each tracker measurement, a "prior pointer" will be set to point to the tracker measurement that was taken prior to a current tracker measurement (step 807). In addition, for each tracker measurement, the display will be refreshed by drawing a line between the displayed point of the custom part corresponding to the previous tracker measurement (as pointed to by the prior pointer) to a currently displayed point of the custom part corresponding to the current tracker measurement (step 808).

As the user measures the relevant points of the custom part, the CAD application will listen for a "change" signal (step 801). The user will select a "change" option if the user determines from the rendered image that the connection between a currently measured point and the previously measured point is an incorrect depiction of the custom part. Accordingly, if the "change" signal is detected (affirmative result in step 802), the prior pointer will be decremented to point to the next previous measurement, and the line will be redrawn from that point to the currently measured point (step 808). If the user determines that the rendered image is still incorrect, the user will signal a "change" and the prior pointer will once again be decremented to point to the next previously measured point and the line will be redrawn from that point to the current point (step 809). This process is repeated (steps 801, 802, 809) until the user determines that the currently measured point has been correctly connected to the appropriate previously measured point.

Once the user has marked all the relevant points of the custom part and has determined that the rendered image of the custom part is a correct depiction of the part, the user will select the "end" option. The "end" signal will be detected (affirmative result in step 803) and the tracker measurement data and connecting lines of the custom part will be stored (step 810). At this point, all the point and connecting line measurements will be known with respect to the docking position (i.e., origin of the TFM). Then, during the part placement process discussed below, using equation 1 above, the orientation of the corners of the custom part can be determined with respect to the coordinate system of the TS and then with respect to the coordinate system of the model, to thereby transform the measured data of the custom part to the CAD model.

Figure 9A:
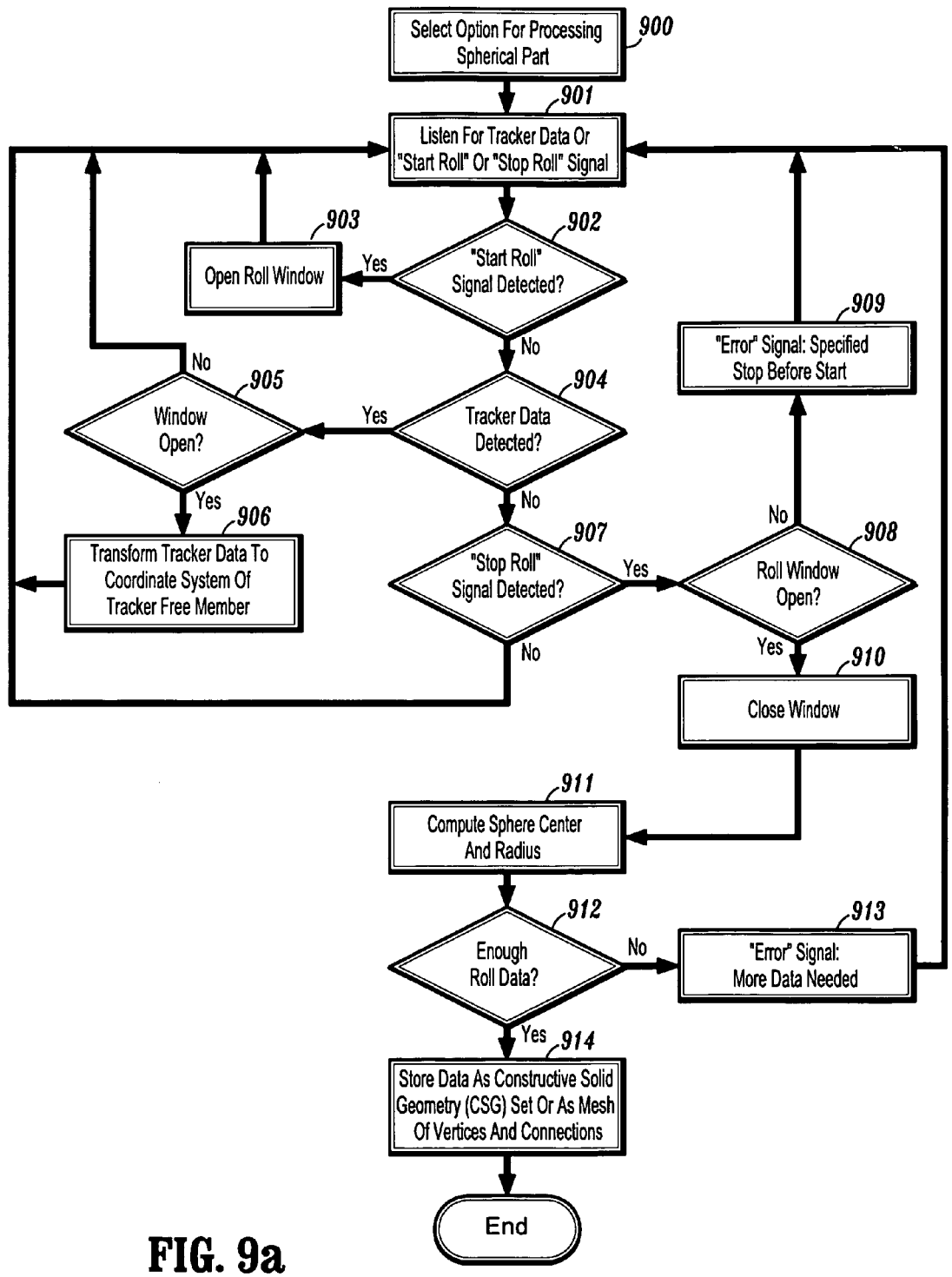
FIG. 9a is a flow diagram of a method for processing a spherical model part according to one aspect of the present invention.

FIG. 9a is a flow diagram of a method for processing a canonic shape according to one aspect of the present invention. In particular, the method depicted in FIG. 9a (in conjunction with FIG. 5d) illustrates, in detail, an exemplary method for marking a spherical model part 501. Initially, the user will select (via a button or icon) an option for processing a spherical model part (step 900). The CAD application continuously listens for a tracker data measurement signal, a "start roll", or a "stop roll" signal (step 901). The user will send a "start roll" signal when the user desires to have a sequence of roll measurements acquired for measuring the radius and center of the spherical model part. For instance, as illustrated in FIG. 5d, the radius of a spherical part 501 may be determined by cradling the part 501 in the apex of the marking jig 24 and rotating the part 501 as indicated by the arrow, for example.

Referring back to FIG. 9a, upon detection of the "stop roll" signal (affirmative result in step 902), the CAD application will open a "roll window" for accepting tracker data associated with the measurement. It is to be understood that the term "window" used herein refers to a time interval in which the CAD application receives the tracker data associated with window type that is opened. Subsequently, when a tracker measurement signal is detected (i.e., tracker data is generated) (affirmative result in step 904) while the roll window is opened (affirmative determination in step 905), the corresponding measured tracker data will be transformed to the coordinate system of the TFM (step 906). If it is determined that a window is not open (negative determination in step 905) indicating the nature of the tracker data, the tracker data will not be processed/accepted until the corresponding window is opened (return to step 901). It is to be understood that various methods may be used for measuring the tracker data while the spherical part is being rolled in the jig. For instance, the tracker data may be continuously measured and processed as the user rolls the part in the jig. In addition, the user may mark any number of discrete points (such as three points) by rotating the sphere in the jig so that the TFM is located at different positions and taking a tracker measurement at such positions. In any event, a sufficient amount of tracker data should be measured so that the CAD application can determine the center of the sphere in relation to the TFM and thereby determine its radius.

The CAD application will continue to process tracker data associated with the "roll" measurements until a "stop roll" signal is detected (as sent by the user) (affirmative result in step 907). Upon detection of a "stop roll" signal, if a "start roll" window is not open (negative determination in step 908), an error signal will be provided indicating that the user specified a "stop roll" before a "start roll" signal was sent (step 909). On the other hand, if a "start roll" window is open (affirmative result in step 908), the window will be closed (step 910) and the CAD application will compute the center and radius of the spherical part (step 911) using the collected roll data.

If there is not enough roll data collected to accurately compute the center and radius of the sphere (negative result in step 912), the CAD application will issue an error signal (step 913) and optionally inform the user to repeat the roll process and/or display a list of what measurement types are needed (e.g., two more points are needed) so that the user can make the necessary measurements. In one embodiment, the previously collected (yet insufficient) roll data may be combined with any newly collected roll data to compute the center and radius parameters. In another embodiment, the previously collected roll data may be disregarded and only the new data considered.

On the other hand, if enough roll data has been collected to accurately compute the center and radius parameters (affirmative result in step 912), then the measured tracker data will be stored as either a constructive solid geometry set or as a mesh of vertices and connections (step 914). In the constructive solid geometry case, the canonic type model parts (e.g. sphere, cylinder, cube, etc.) and their corresponding parameters (radius, length, etc.) are stored. Further, more complicated parts can be "constructed" by specifying combinations of canonic shapes, e.g., a thick plate having holes through it would be specified as a cuboid (rectangular box) with cylinders subtracted out for the holes. In the mesh of vertices case, a list of 3-D points and a list of connections are stored (e.g., point A connected to point B, point A connected to point C, etc.).

Figure 9B:
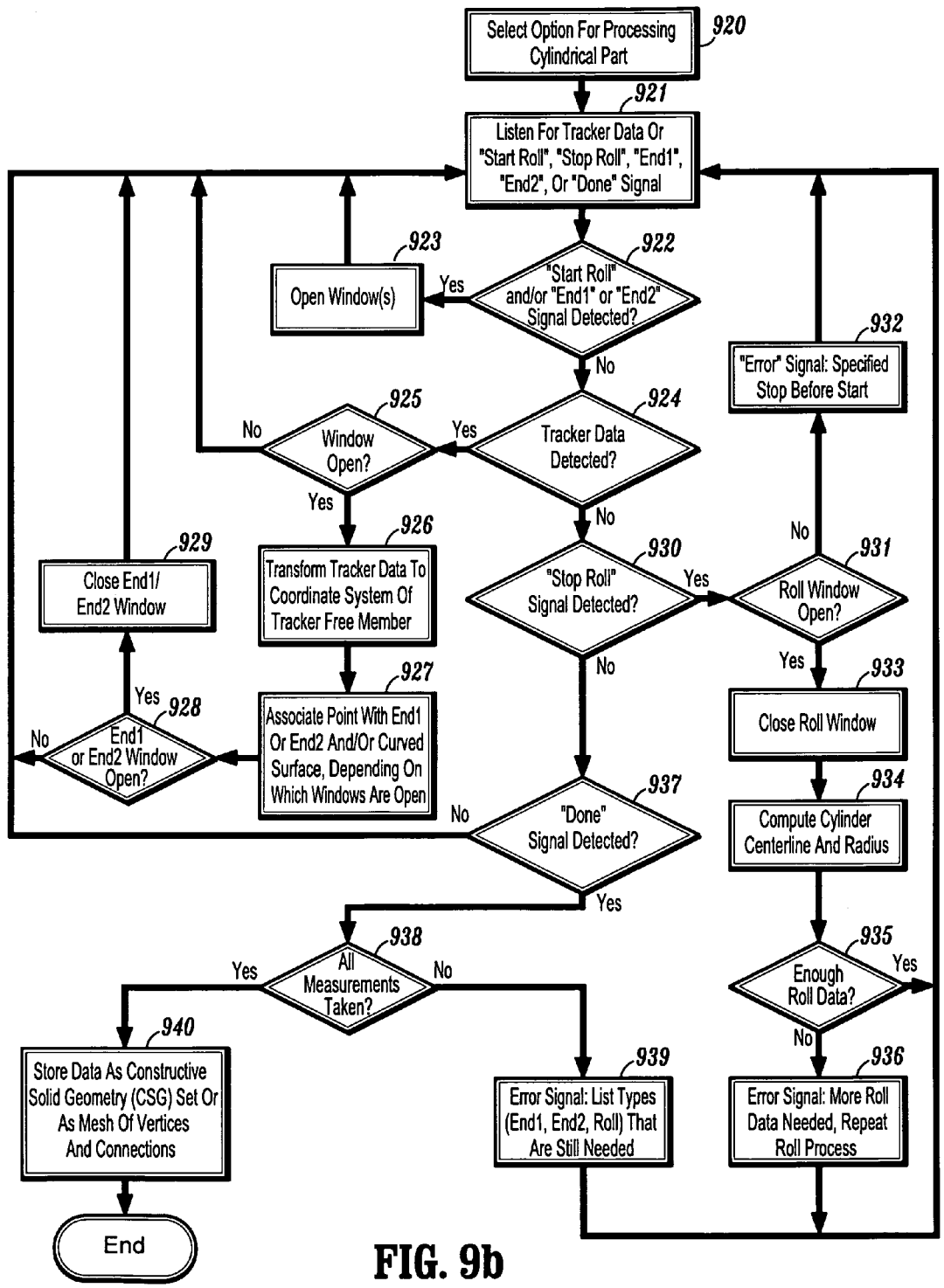
FIG. 9b is a flow diagram of a method for processing a cylindrical model part according to one aspect of the present invention.

FIG. 9b is a flow diagram of a method for processing a canonic shape according to another aspect of the present invention. In particular, the method depicted in FIG. 9b (in conjunction with FIG. 5b) illustrates, in detail, an exemplary method for marking a cylindrical model part. Initially, the user will select (via a button or icon) an option for processing a cylindrical model part (step 920). The CAD application continuously listens for a tracker data measurement signal, a "start roll", a "stop roll", an "end1", an "end2", or a "done" signal (step 921). The user will send a "start roll" signal step if a sequence of roll measurements is to be acquired for measuring a radius of the cylindrical model part. For instance, as illustrated in FIG. 5b, the radius of a cylindrical part 500 may be determined by cradling the part 500 in the marking jig 25 and rotating the part 500 as indicated by the arrow. The user may send either an "end1" or an "end2" signal if the user is marking the ends of the cylindrical part 500. As shown in FIGS. 5a and 5b, each end of the cylindrical part 500 may be measured by contacting the end to the reference surface 25a of the marking jig 25. Alternatively, the user may send a "start roll" signal in combination with the "end1" or "end2" signal so that the user can simultaneously mark the desired end while measuring the radius. Upon detection of any of these signals (affirmative result in step 922), the CAD application will open the corresponding window(s) for accepting tracker data associated with the measurement (step 923).

When a tracker measurement signal is detected (i.e., tracker data is generated) (affirmative result in step 924), if it is determined that a window is not open (negative determination in step 925) indicating the nature of the tracker data, the tracker data will not be processed/accepted until a window is opened (return to step 921). On the other hand, if it is determined that a window (or windows) is open (affirmative determination in step 925), upon detection of the tracker data, the corresponding measured tracker data will be transformed to the coordinate system of the TFM (step 926). Depending on the open window(s), the tracker measurement will be associated with the point on the model part corresponding to the open window(s) (step 927). Again, as indicated above, the open window(s) may correspond to a "start roll" measurement, both "start roll" and "end1" measurement or both "start roll" and "end2" measurements. If an open window corresponds to an "end1" or "end2" measurement, (affirmative result in step 928), the window will be automatically closed since a single measurement suffices for the cylindrical ends. If the open window does not correspond to an "end1" or "end2" measurement (i.e., only a "start roll" window is open) (negative result in step 928), then the CAD application will continue to process tracker data associated with the "roll" measurements (repeat steps 924–927) until a "stop roll" signal is sent by the user.

Upon detection of a "stop roll" signal (affirmative result in step 930), if a "start roll" window is not open (negative result in step 931, an error signal will be provided indicating that the user specified a "stop roll" before a "start roll" signal was sent (step 932). On the other hand, if a "start roll" window is open (affirmative result in step 931), the roll window will be closed (step 933) and the CAD application will compute the centerline and radius of the cylindrical part (step 934). If there is not enough roll data collected to accurately compute the centerline and radius of the cylinder (negative result in step 935), the CAD application will issue an error signal (step 936) and optionally inform the user to repeat the roll process and/or display a list of what measurements are needed (e.g., two more points are needed) so that the user can make the necessary measurements. As with the roll measurements discussed above, the roll data may comprise a plurality of continuous measurements representing the roll movement or discrete measurements representing different positions. In addition, either the previously collected (yet insufficient) roll data may be combined with any newly collected roll data to compute the center and radius parameters or the previously collected roll data may be disregarded and only the new data considered.

When the user is finished measuring the cylindrical part, the user will send a "done" signal. Upon detection of the "done" signal (affirmative result in step 937), a determination will be made as to whether all the relevant measurements have been taken (step 938) (e.g., did the user take end1, end2 and roll measurements). If it is determined that more data is needed (negative result in step 938), the CAD application will issue an error signal (step 939) and optionally display a list of what measurement types are needed so that the user can make the necessary measurements (e.g., whether the radius and both ends of a cylindrical part have been measured). On the other hand, if enough measurements have been taken (affirmative result in step 938), then the measured tracker data will be stored as either a constructive solid geometry set or as a mesh of vertices and connections (step 940).

It is to be understood that the methods described above with reference to FIGS. 9a and 9b are illustrative techniques for measuring spherical and cylindrical parts and that additional steps may be employed for measuring such part, as well as other model parts having a geometry that is defined, at least in part, by a radius or diameter. Furthermore, based on the teachings herein, it should be readily apparent to those skilled in the art that other specialized marking jigs may be designed for measuring canonic shapes in addition to the exemplary marking jigs illustrated in FIG. 5.

It is to be further understood that the exemplary canonic shape marking processes of FIGS. 9a and 9b are specialized versions of the relational process discussed above to the extent that such shapes are defined in the CAD library and the corresponding model parts can be measured by comparing the TFM position and one or more relevant points of the part with the reference shape in the CAD library. For instance, the CAD library shapes may include the following: a cylinder where one or more of the part point positions is on the cylinder axis and one or more other of the part point positions is on the cylinder surface; a sphere where one of the part points positions is the center of the sphere and one or more other of the part point positions is on the sphere surface; a cone with a circular base where one of the part points positions is on the cone axis and one or more other of the part point positions is on the cone surface; a parallelepiped where one or more of the part points positions are two opposite corners of the parallelepiped; a pyramid and one or more of the part points positions is a corner of the pyramid; an elliptical cylinder and one or more of the part point positions is on the cylinder center axis and the other part point positions are on the cylinder surface; and an ellipsoid and one of the part points positions is the center of the ellipsoid and the other part point positions are on the ellipsoid surface.

Figure 10:
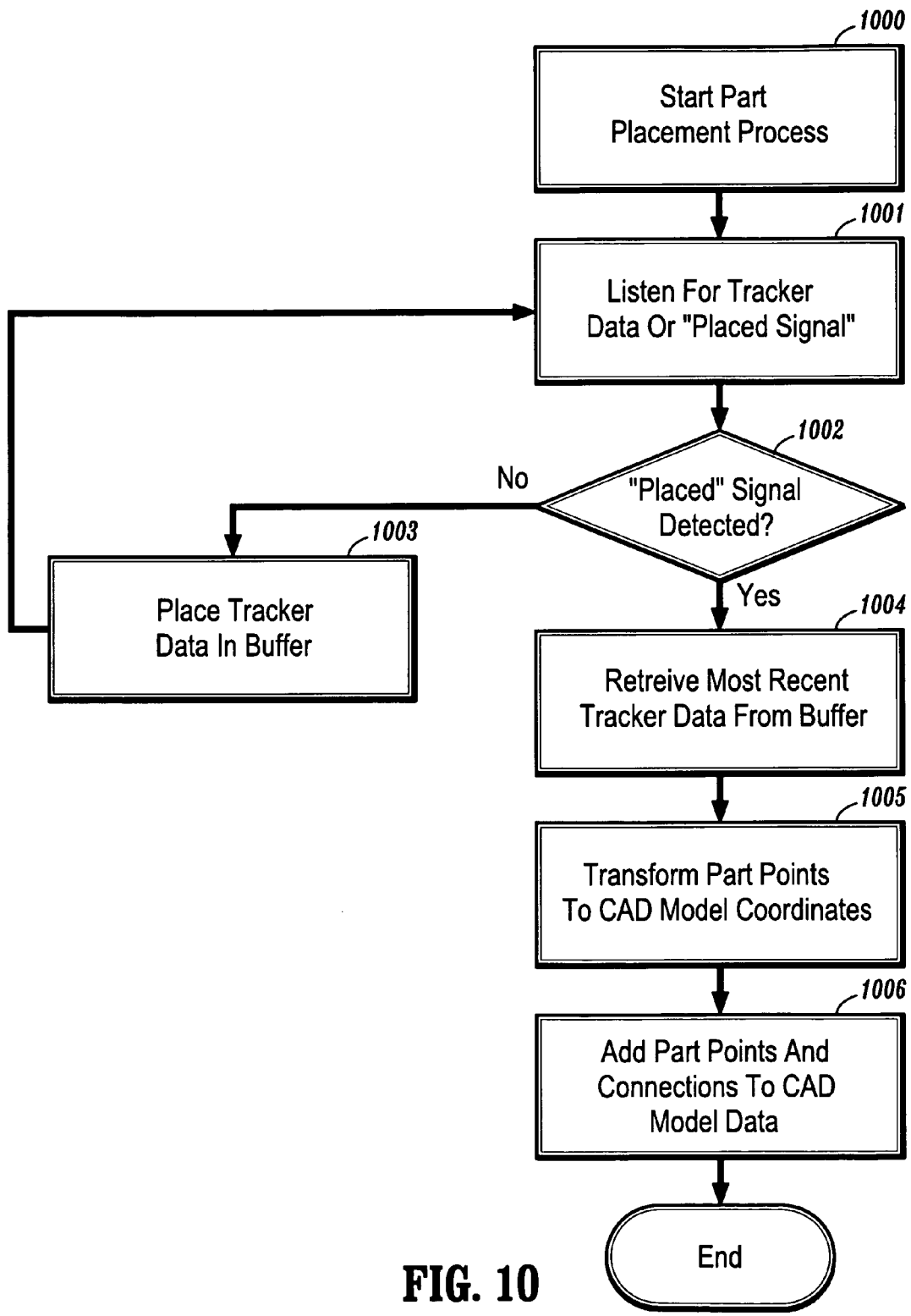
FIG. 10 is a method for processing the placement of a model part in a physical model according to one aspect of the present invention.

Referring now to FIG. 10, a flow diagram illustrates a method for processing the placement of a model part in a physical model according to one aspect of the present invention. In particular, the method depicted in FIG. 10 illustrates, in detail, an exemplary method of operation of the part placement module 310 described above with reference to FIG. 3. It is assumed in FIG. 10 that as the TFM is moved, tracker measurements are continuously made. After the user is finished performing any one of the part processing methods described above in FIGS. 6, 7, 8 or 9, the user will place the measured model part in the physical model to simultaneously update the CAD model of assembly. More specifically with the TFM attached to the model part, the user will start the part placement procedure (step 1000) by maneuvering the TFM to place the measured part in its desired position in the physical model assembly. As the TFM is maneuvered, the tracking system will continuously measure the tracker data (step 1001) to determine the position and orientation of the part being placed with respect to the CAD model. The measured tracker data will be stored in a buffer (step 1003).

Once the user has positioned the model part in the desired position, the user will send a "placed" signal. For instance, the "placed" signal may be generated upon the user actuating a button to release the model part from the TFM. Once the "placed" signal is detected, the CAD application will retrieve the most recently measured tracker data from the buffer (i.e., the position and orientation of the model part with respect to the TFM just prior to the release of the part from the TFM) (step 1004). This tracker data is then processed to transform the part points to the CAD model coordinates (i.e., determine the position and orientation of the part with respect to the CAD model) (step 1005). Then, the CAD representation of the model part is added to the CAD model of assembly (step 1006). The computer display of the assembled CAD model is then refreshed to show the addition of the model part.

In addition, as noted above, because of uncertainties in the tracking data and in the physical positioning of the model parts, the resulting corner positions in the CAD data might not be completely regular. For instance, sides that are supposed to be parallel and corners that are supposed to be square might not adhere to specifications. To rectify this problem, the CAD application affords the capability to snap the corners to a three-dimensional grid, to apply certain constraints, such as a uniform height of walls or square corners, and to allow the user to adjust the corner data by manual input.

It is to be appreciated that once the physical model is completed, the corresponding CAD model comprises the ensemble of CAD representations of the individual parts. The CAD model can then be subjected to the conventional CAD visualization image rendering techniques for rendering images of the CAD model from desired positions and angles. For example, in the case of an architectural model, simulated views from the interior and around the exterior of the model can be generated to show how the structure would appear at full scale.

It is to be understood that other implementations of the tracker system may be employed for measuring tracking data in accordance with the present invention. For instance, rather than using a single TFM as described above, a second TFM can be used to mark the part corners while the first TFM is attached to the part. This embodiment is an alternative to the embodiment described above wherein the part corners, radius, etc., are measured using fixed reference points (e.g., jigs and reference points). Instead, the user can hold in one hand the first TFM with the part attached thereto, while holding the second TFM in the other hand and touching the second TFM to points on the part. Using appropriate transformation relationships between the first TFM, the second TFM, and the TS, the tracker data can be related to the coordinate system of the CAD model.

In another embodiment, a second TFM can be attached to the physical model assembly, thereby allowing TS to track the location of the physical model if it is moved about the room (as opposed to having to keep the model stationary with respect to the TS). Again, using appropriate transformation relationships between the first TFM, the second TFM, and the TS, the tracker data can be related to the coordinate system of the CAD model. Another embodiment combines the benefits of the above embodiments by employing three TFMs, one attached to the model, one attached to the part being measured and one being used to mark points on the part. Furthermore, one skilled in the art can readily envision other embodiments using multiple TFMs based on the teachings herein.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A CAD (computer-aided design) system, comprising:
    a data processing system comprising a CAD application, the CAD application being executed by the data processing system to generate a CAD model of a physical model, the CAD model comprising a plurality of CAD representations, wherein each CAD representation corresponds to an individual component part of the physical model; and
    a tracking system for generating tracker data associated with a given component part, wherein the CAD application processes the tracker data to generate a CAD representation of the given component part and to determine the position and orientation of the given component part with respect to the physical model before and after as the given component part is placed in a desired position in the physical model.

2. The system of claim 1, further comprising a library for storing CAD representations of component parts used for constructing the physical model.

3. The system of claim 2, wherein the tracking system comprises:
    a stationary tracker source (TS); and
    a sensor circuit embedded in the given component part for sensing the position of the given component part with respect to the TS and for generating the tracker data, wherein the sensor circuit stores a part identification (ID) code that is transmitted to the data processing system for the CAD application to retrieve a CAD representation from the library based on the part ID code.

4. The system of claim 2, wherein the tracking system comprises:
    a stationary tracker source (TS); and
    a tracker free member (TFM) for sensing its position with respect to the TS and generating the tracker data, wherein the TFM comprises a docking mechanism for connecting the TFM to the given component part at a docking position on the given component part.

5. The system of claim 4, wherein the docking position is one of arbitrary and pre-determined.

6. The system of claim 4, wherein the docking mechanism of the TFM insertably engages a receptacle on the given component part.

7. The system of claim 6, wherein a part ID (identification) of the given component part is encoded by the shape of the receptacle, and wherein the docking mechanism of the TFM senses the shape of the receptacle to identify the part and send a signal to the data processing system to retrieve a CAD representation from the library based on the part ID.

8. The system of claim 6, wherein the given component part comprises a microchip having a part ID code, the microchip being electrically coupled to the docking mechanism of the TFM upon connection of the TFM to the given component part so as to transmit the part ID to the data processing system to retrieve a CAD representation from the library based on the part ID.

9. The system of claim 4, wherein the docking mechanism comprises one of a suction device and an adhesion device.

10. The system of claim 4, further comprising a marking jig for measuring tracker data of relevant points of the given component part to generate a CAD representation of the given component part.

11. The system of claim 10, wherein the marking jig comprises a fixed reference point.

12. The system of claim 10, wherein the relevant points include at least one corner of the given component part.

13. The system of claim 10, wherein the relevant points include all corners of the given component part.

14. The system of claim 10, wherein the marking jig is configured for measuring tracker data associated with a radius of the given component part.

15. A method for generating a CAD (computer-aided design) model of a corresponding physical model comprising a plurality of component physical parts, the method comprising the steps of:
    generating a CAD representation of a given component physical part based on relevant points of the component physical part;
    tracking coordinates of the relevant points of the CAD representation of the component physical part in relation to coordinates of the CAD model before and after the physical component part is placed in a desired position in the physical model; and
    adding the CAD representation of component physical part to the CAD model such that the CAD model comprises an ensemble of individual CAD representations of component physical parts.

16. The method of claim 15, wherein the step of generating a CAD representation of the component physical part comprises the steps of:
    connecting a tracker free member (TFM) to the component physical part at a docking position on the component physical part;
    obtaining coordinate data for each of the relevant points of the component physical part;
    processing the coordinate data for each of the relevant points to determine the position and orientation of each of the relevant points of the component physical part in relation to the TFM.

17. The method of claim 16, further comprising the step of rendering an image of the component physical part attached to the TFM using the processed coordinate.

18. The method of claim 16, wherein the step of obtaining coordinate data for each of the relevant points of the component physical part comprises the steps of:
    obtaining a part identification (ID) code associated with the component physical part; and
    retrieving pre-stored geometry data and docking position data associated with the component physical part based on the part ID code.

19. The method of claim 18, wherein the step of obtaining a part ID code comprises the steps of:
    insertably engaging a docking mechanism of the TFM with a docking receptacle of the component physical part;
    encoding the part ID based on a shape of the docking receptacle;
    sensing the shape of the docking receptacle; and
    transmitting a corresponding part ID from the TFM based on the sensed shape of the docking receptacle.

20. The method of claim 18, wherein the step of obtaining a part ID code comprises the steps of:
    insertably engaging a docking mechanism of the TFM with a docking receptacle of the component physical part to operatively connect the docking mechanism to a microchip in the component physical part;
    retrieving the part ID from the microchip; and
    transmitting the retrieved part ID from the TFM.

21. The method of claim 16, wherein the step of obtaining coordinate data for each of the relevant points of the component physical part comprises the steps of:
    obtaining pre-stored geometry data of the relevant points associated with the component physical part;
    measuring coordinates of a portion of the relevant points of the component part;
    comparing the measured coordinates with the pre-stored geometry data;
    computing the docking position of the TFM on the component physical part, if a match is found between the measured coordinates and the geometry data of corresponding relevant points;
    determining a remainder of the relevant points of the component physical model based on the computed docking position and geometry data.

22. The method of claim 21, further comprising the steps of:
    rendering images of the component physical part each having an alternative docking position, if a match is not found between the measured coordinates and the geometry data; and
    selecting the image with a desired docking position.

23. The method of claim 16, wherein the step of obtaining coordinate data for each of the relevant points of the component physical part comprises the steps of:
    measuring the coordinates of successive relevant points of the component part;
    rendering an image of the component physical part, wherein the image is dynamically generated by connecting a line from a current measured point to a last measured point; and
    re-connecting the line from the current measured point to any previous measured point, if the rendering of the connection between the current measured point and last measured point is an incorrect depiction of the component physical part.

24. The method of claim 16, wherein the step of processing the coordinate data for each of the relevant points to determine the position and orientation of each of the relevant points of the component physical part in relation to the TFM comprises the steps of:
    computing coordinates of the docking position of the TFM on the component physical part; and
    transforming the coordinates of the relevant points to the coordinates of the TFM using the computed docking position.

25. The method of claim 15, further comprising the step of refining the CAD representation before adding the CAD representation to the CAD model.

26. The method of claim 15, further comprising the step of storing the CAD representation of the component physical part in a CAD library.

27. A program storage device readable by a recognition machine, tangibly embodying a program of instructions executable by the machine to perform method steps for generating a CAD (computer-aided design) model of a corresponding physical model comprising a plurality of component physical parts, the method comprising the steps of:
    generating a CAD representation of a given component physical part based on relevant points of the component physical part;
    tracking coordinates of the relevant points of the CAD representation of the component physical part in relation to coordinates of the CAD model before and after the physical component part is placed in a desired position in the physical model; and
    adding the CAD representation of component physical part to the CAD model such that the CAD model comprises an ensemble of individual CAD representations of component physical parts.

28. The program storage device of claim 27, wherein the instructions for performing the step of generating a CAD representation of the component physical part comprise instructions for performing the steps of:
- obtaining coordinate data for each of the relevant points of the component physical part;
- processing the coordinate data for each of the relevant points to determine the position and orientation of each of the relevant points of the component physical part in relation to coordinates of a tracker free member (TFM) attached to the component physical part at a docking position on the component physical part.

29. The program storage device of claim 28, further comprising instructions for performing the step of rendering an image of the component physical part attached to the TFM using the processed coordinates.

30. The program storage device of claim 28, wherein the instructions for performing the step of obtaining coordinate data for each of the relevant points of the component physical part comprise instructions for performing the steps of:
- receiving a part identification (ID) code associated with the component physical part; and
- retrieving pre-stored geometry data and docking position data associated with the component physical part based on the part ID code.

31. The program storage device of claim 30, wherein the part ID code is received from one of the TFM or by user input.

32. The program storage device of claim 28, wherein the step of obtaining coordinate data for each of the relevant points of the component physical part comprises the steps of:
- obtaining pre-stored geometry data of the relevant points associated with the component physical part;
- receiving tracker data from the TFM comprising measured coordinates of a portion of the relevant points of the component part;
- comparing the measured coordinates with the pre-stored geometry data;
- computing the docking position of the TFM on the component physical part, if a match is found between the measured coordinates and the geometry data of corresponding relevant points;
- determining a remainder of the relevant points of the component physical model based on the computed docking position and geometry data.

33. The program storage device of claim 32, further comprising instructions for performing the steps of rendering images of the component physical part each having an alternative docking position, if a match is not found between the measured coordinates and the geometry data for a user to select the image with a desired docking position.

34. The program storage device of claim 28, wherein the instructions for performing the step of obtaining coordinate data for each of the relevant points of the component physical part comprise instructions for performing the steps of:
- receiving tracker data from the TFM comprising measured coordinates of successive relevant points of the component part;
- rendering an image of the component physical part, wherein the image is dynamically generated by connecting a line from a current measured point to a last measured point; and
- re-connecting the line from the current measured point to any previous measured point, in response to a signal sent by the user.

35. The program storage device of claim 28, wherein the instructions for performing the step of processing the coordinate data for each of the relevant points to determine the position and orientation of each of the relevant points of the component physical part in relation to the TFM comprise instructions for performing the steps of:
- computing coordinates of the docking position of the TFM on the component physical part; and
- transforming the coordinates of the relevant points to the coordinates of the TFM using the computed docking position.

36. The program storage device of claim 27, further comprising instructions for performing the step of refining the CAD representation before adding the CAD representation to the CAD model.

37. The program storage device of claim 27, further comprising instructions for performing the step of storing the CAD representation of the component physical part in a CAD library.

* * * * *